US009021332B2

(12) United States Patent
Haratsch et al.

(10) Patent No.: US 9,021,332 B2
(45) Date of Patent: Apr. 28, 2015

(54) FLASH MEMORY READ ERROR RECOVERY WITH SOFT-DECISION DECODE

(71) Applicant: LSI Corporation, San Jose, CA (US)

(72) Inventors: Erich F. Haratsch, Bethlehem, PA (US); Jeremy Werner, San Jose, CA (US); Zhengang Chen, San Jose, CA (US); Earl T. Cohen, Oakland, CA (US); Yunxiang Wu, Cupertino, CA (US); Ning Chen, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 67 days.

(21) Appl. No.: 13/798,864

(22) Filed: Mar. 13, 2013

(65) Prior Publication Data

US 2014/0164868 A1 Jun. 12, 2014

Related U.S. Application Data

(60) Provisional application No. 61/735,923, filed on Dec. 11, 2012.

(51) Int. Cl.
| | |
|---|---|
| *G11C 29/00* | (2006.01) |
| *G06F 11/10* | (2006.01) |
| *H03M 13/37* | (2006.01) |
| *H03M 13/00* | (2006.01) |
| *H03M 13/11* | (2006.01) |
| *H03M 13/39* | (2006.01) |
| *H03M 13/41* | (2006.01) |

(52) U.S. Cl.
CPC ....... *G06F 11/1012* (2013.01); *H03M 13/1108* (2013.01); *H03M 13/1111* (2013.01); *H03M 13/3707* (2013.01); *H03M 13/3905* (2013.01); *H03M 13/41* (2013.01); *H03M 13/6561* (2013.01)

(58) Field of Classification Search
CPC .......... G06F 11/1012; H03M 13/6561; H03M 13/3707; H03M 13/1108; H03M 13/1111; H03M 13/3905; H03M 13/41
USPC .................. 714/752, 763, 773, 780, 794, 795
See application file for complete search history.

(56) References Cited

U.S. PATENT DOCUMENTS

| | | | | |
|---|---|---|---|---|
| 7,877,564 | B2 | 1/2011 | Eldredge et al. | 711/163 |
| 7,966,546 | B2 * | 6/2011 | Mokhlesi et al. | 714/773 |
| 8,078,940 | B2 * | 12/2011 | Uchikawa et al. | 714/764 |
| 8,301,948 | B2 | 10/2012 | Blaum et al. | 714/746 |
| 8,301,979 | B2 * | 10/2012 | Sharon et al. | 714/763 |
| 2011/0239089 | A1 | 9/2011 | Haratsch et al. | 714/763 |
| 2013/0104005 | A1 * | 4/2013 | Weingarten et al. | 714/773 |

* cited by examiner

*Primary Examiner* — John P Trimmings

(74) *Attorney, Agent, or Firm* — Christopher P. Maiorana, PC

(57) ABSTRACT

An apparatus having a circuit and one or more processor is disclosed. The circuit is configured to receive a codeword from a memory. The memory is nonvolatile. The codeword generally has one or more errors. The processors are configured to generate read data by decoding the codeword repeatedly. The decoding includes a soft-decision decoding that uses a plurality of parameters calculated by (i) a first procedure, (ii) a second procedure in response to a plurality of failures of the decoding to converge using the first procedure and (iii) a third procedure in response to another failure of the decoding to converge using the second procedure.

20 Claims, 6 Drawing Sheets

FLASH MEMORY READ ERROR RECOVERY WITH SOFT-DECISION DECODE

FIELD OF THE INVENTION

The invention relates to nonvolatile memory generally and, more particularly, to a method and/or apparatus for implementing a Flash memory read error recovery with soft-decision decode.

BACKGROUND

When an error correction decoding fails for a codeword stored in a nonvolatile memory, a controller enters a recovery mode to retrieve the stored data. With a conventional hard-decision decoder, the recovery typically involves adjusting references voltages used by the nonvolatile memory, re-reading the codeword and re-decoding the codeword. The hard-decision recovery mode is effective where the failure is due to a regular change in a distribution of the reference voltages, such as due to a drift in one direction. With a conventional soft-decision decoder, the controller aggregates soft information from multiple reads. The soft-decision decoder achieves a same uncorrectable bit error rate target at a worse raw bit error rate as the hard-decision decoder in the recovery mode.

SUMMARY

The invention concerns an apparatus having a circuit and one or more processors. The circuit is configured to receive a codeword from a memory. The memory is nonvolatile. The codeword generally has one or more errors. The processors are configured to generate read data by decoding the codeword repeatedly. The decoding includes a soft-decision decoding that uses a plurality of parameters calculated by (i) a first procedure, (ii) a second procedure in response to a plurality of failures of the decoding to converge using the first procedure and (iii) a third procedure in response to another failure of the decoding to converge using the second procedure.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing a nonvolatile memory read error recovery with soft-decision decode that may (i) meet an uncorrectable bit error rate criteria at or beyond an end of life of nonvolatile memory devices, (ii) reduce a recovery time for a read failure, (iii) perform a read and a write in parallel, (iv) perform an error recovery and a normal read in parallel and/or (v) be implemented as one or more integrated circuits.

The invention generally provides a system-level error recovery policy in a solid state drive (e.g., SSD) controller. The controller implements a soft-decision decode technique, such as a low-density parity-check (e.g., LDPC) decoding technique, for codewords (or Epages) received from a nonvolatile (e.g., Flash) memory device of the solid state drive. In normal read operations, the controller often succeeds with on-the-fly decoding. If the on-the-fly decoding fails, one or more error recovery procedures are used to retrieve the requested data. The error recovery policy takes advantage of a soft-decision decoder, such as a soft-decision low-density parity-check (e.g., SLDPC) decoder, in the controller. In each retry step, input parameters to the soft-decision decoder are adjusted based on a number of existing digital signal processing (e.g., DSP) procedures (or techniques). The error recovery policy generally makes one or more best efforts until either the soft-decision decoder succeeds or all recovery procedures fail. The error recovery policy also exploits parallelism with multiple hardware processors/units in the controller to reduce a recovery time. According to various embodiments, the soft-decision decoder comprises one or more of: a soft-decision low-density parity check decoder; a soft-decision polar decoder; a soft-decision trellis decoder; a soft-decision Viterbi decoder; and any other type of soft-decision decoder.

In various embodiments, each page of the nonvolatile memory is divided into one or more ECC-pages (or Epages). Each Epage is an amount of user data and the corresponding ECC data that, together, comprise an ECC codeword (e.g., a correctable unit). An integer number of Epages generally exist per page of the nonvolatile memory. Typically, Epages may have 1 kilobytes or 2 kilobytes of user data, and an even share of the remaining bytes in the nonvolatile memory page (so that all Epages in a given nonvolatile memory page are the same total size).

Figure 1:
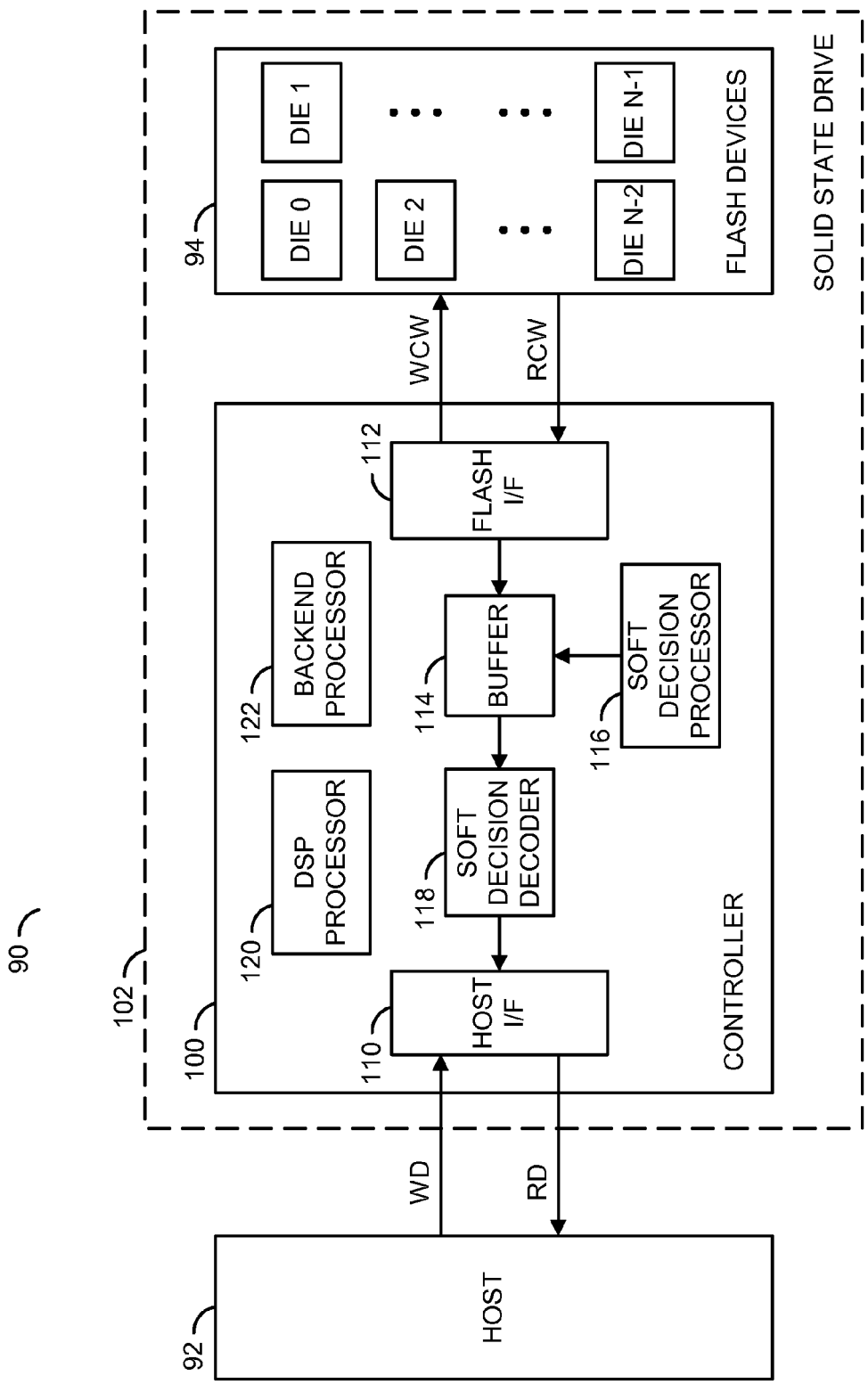
FIG. 1 is a block diagram of an example implementation of an apparatus.

Referring to FIG. 1, a block diagram of an example implementation of an apparatus 90 is shown. The apparatus (or circuit or device or integrated circuit) 90 implements a computer having a nonvolatile memory circuit. The apparatus 90 generally comprises a block (or circuit) 92, a block (or circuit) 94 and a block (or circuit) 100. The circuits 92 to 100 may represent modules and/or blocks that may be implemented as hardware, software, a combination of hardware and software, or other implementations. A combination of the circuits 94 and 100 form a solid state drive circuit 102.

A signal (e.g., WD) is generated by the circuit 92 and presented to the circuit 100. The signal WD generally conveys write data to be written into the circuit 94. A signal (e.g., WCW) is generated by the circuit 100 and transferred to the circuit 94. The signal WCW carries error correction coded (e.g., ECC) write codewords written into the circuit 94. A signal (e.g., RCW) is generated by the circuit 94 and received by the circuit 100. The signal RCW carries error correction coded codewords read from the circuit 94. A signal (e.g., RD) is generated by the circuit 100 and presented to the circuit 92. The signal RD carries error corrected versions of the data in the signal RCW.

The circuit 92 is shown implemented as a host circuit. The circuit 92 is generally operational to read and write data to and from the circuit 102. When writing, the circuit 92 presents the write data in the signal WD. The read data requested by the circuit 92 is received via the signal RD.

The circuit 94 is shown implemented as a nonvolatile memory circuit. According to various embodiments, the circuit 94 comprises one or more: nonvolatile semiconductor devices, such as NAND Flash devices, Phase Change Memory (e.g., PCM) devices, or Resistve RAM (e.g., ReRAM) devices; portions of a solid state drive having one or more nonvolatile memory devices (or dies); and any other volatile or nonvolatile storage media. The circuit 94 is generally operational to store data in a nonvolatile condition.

The circuit 100 is shown implemented as a controller circuit. The circuit 100 is generally operational to control reading to and writing from the circuit 94. The circuit 100 may be implemented as one or more integrated circuits (or chips or die). The circuit 100 is used for controlling one or more solid state drives, embedded storage, nonvolatile memory devices, or other suitable control applications.

The circuit 100 generally comprises a block (or circuit) 110, a block (or circuit) 112, a block (or circuit) 114, a block (or circuit) 116, a block (or circuit) 118, a block (or circuit) 120 and a block (or circuit) 122. The circuits 110 to 122 may represent modules and/or blocks that may be implemented as hardware, software, a combination of hardware and software, or other implementations.

The circuit 110 is shown implemented as a host interface circuit. The circuit 110 is operational to provide communication with the circuit 92 via the signals WD and RD. Other signals may be implemented between the circuits 92 and 110 to meet the criteria of a particular application.

The circuit 112 is shown implemented as a nonvolatile memory (e.g., Flash) interface circuit. The circuit 112 is operational to provide communication with the circuit 94 via the signals WCW and RCW. Other signals may be implemented between the circuits 94 and 110 to meet the criteria of a particular application.

The circuit 114 is shown implemented as a buffer circuit. The circuit 114 is operational to buffer codeword received from the circuit 94 via the circuit 112. The circuit 114 is also operational to buffer decoding parameters generated by the circuit 116. The read codewords and the decoding parameters are presented from the circuit 114 to the circuit 118.

The circuit 116 is shown implemented as a soft-decision processor circuit. The circuit 116 is operational to generate decoding parameters (e.g., log likelihood ratio (LLR) values) used in a soft-decision decoding performed by the circuit 118. The decoding parameters are presented by the circuit 116 to the circuit 114 for storage, or in other embodiments (not illustrated) to circuit 118. The circuit 116 may be implemented as a dedicated hardware unit that processes raw soft bits read from circuit 94. The circuit 116 may be implemented as a processor core (e.g., an ARM core) or a custom designed circuit.

The circuit 118 is shown implemented as a soft-decision decoder circuit. In some embodiments, the circuit 118 is implemented as one or more low-density parity-check decoder circuits. The circuit 118 is operational to perform both hard-decision (e.g., HD) decoding and soft-decision (e.g., SD) decoding of the codewords received from the circuit 114. The soft-decision decoding generally utilizes the decoding parameters created by the circuit 116 and/or the circuits 120 and 122.

The circuit 120 is shown implemented as a digital signal processor circuit. The circuit 120 is operational to command and/or assist with multiple read/write requests while the error recovery is taking place. The circuit 120 is also operational provide log likelihood ratio compensation, calculate entries in an inter-cell interference (e.g., ICI) lookup table (e.g., LUT) and perform inter-cell interference cancellations.

The circuit 122 is shown implemented as a backend (e.g., BE) processor circuit. The circuit 122 is operational to command and/or assist with the multiple read/write requests while the error recovery is taking place. The circuit 122 is also operational to control one or more reference voltages used in the circuit 94 to read the codewords and recorder hard-decision codewords in a data buffer (e.g., DB). In some embodiments, the data buffer is held in the circuit 114. Other numbers of processors (e.g., 120 and 122) may be implemented in the circuit 100 to meet the criteria of a particular application.

Figure 2:
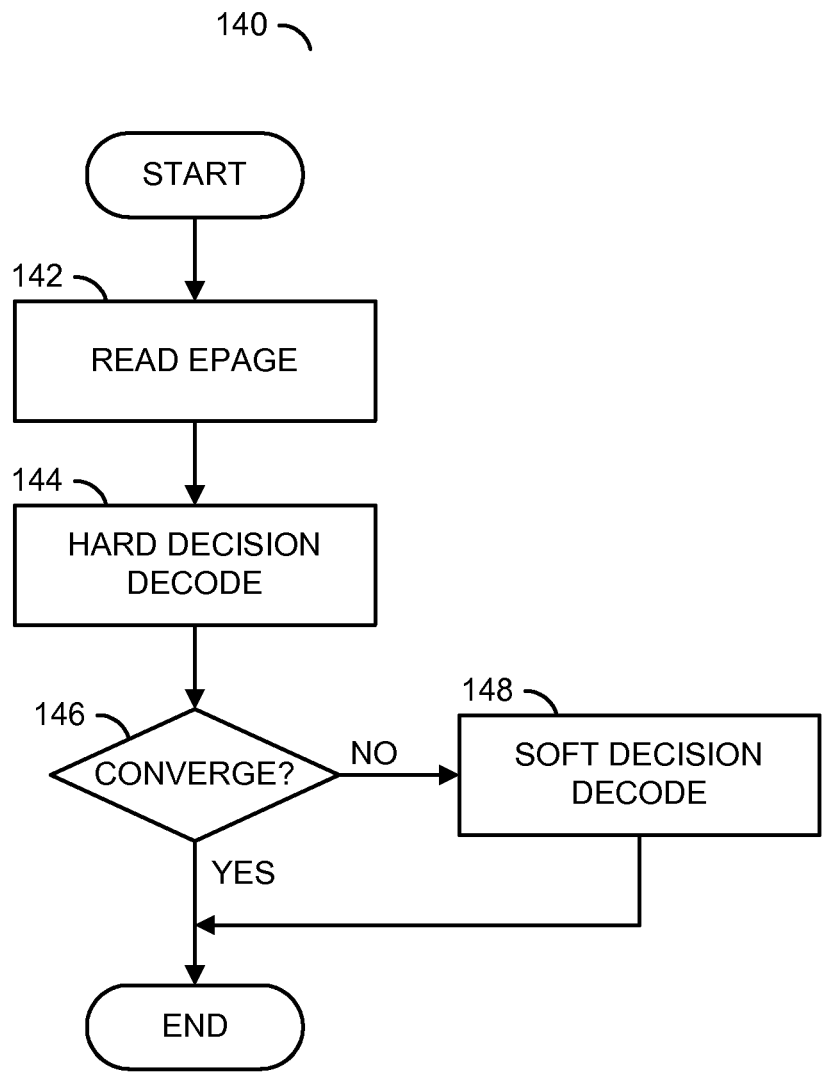
FIG. 2 is a flow diagram of an example method for a read error recovery of a codeword.

Referring to FIG. 2, a flow diagram of an example method 140 for a read error recovery of a codeword is shown. The method (or process) 140 is implemented by the circuit 100. The method 140 generally comprises a step (or state) 142, a step (or state) 144, a step (or state) 146 and a step (or state) 148. The steps 142 to 148 may represent modules and/or blocks that may be implemented as hardware, software, a combination of hardware and software, or other implementations. The sequence of the steps is shown as a representative example. Other step orders may be implemented to meet the criteria of a particular application.

In the step 142, an Epage (or codeword) is read from the circuit 94 by the circuit 100 and buffered in the circuit 114. A hard-decision (e.g., HD) decoding is performed by the circuit 118 in the step 144. If the hard-decision decoding converges per the step 146, the decoded data is presented in the signal RD from the circuit 110 to the circuit 92. If the hard-decision decoding does not converge per the step 146, a soft-decision decoding process is performed by at least one or more of the circuits 114, 116, 118 and 120 in the step 148.

Figure 3:
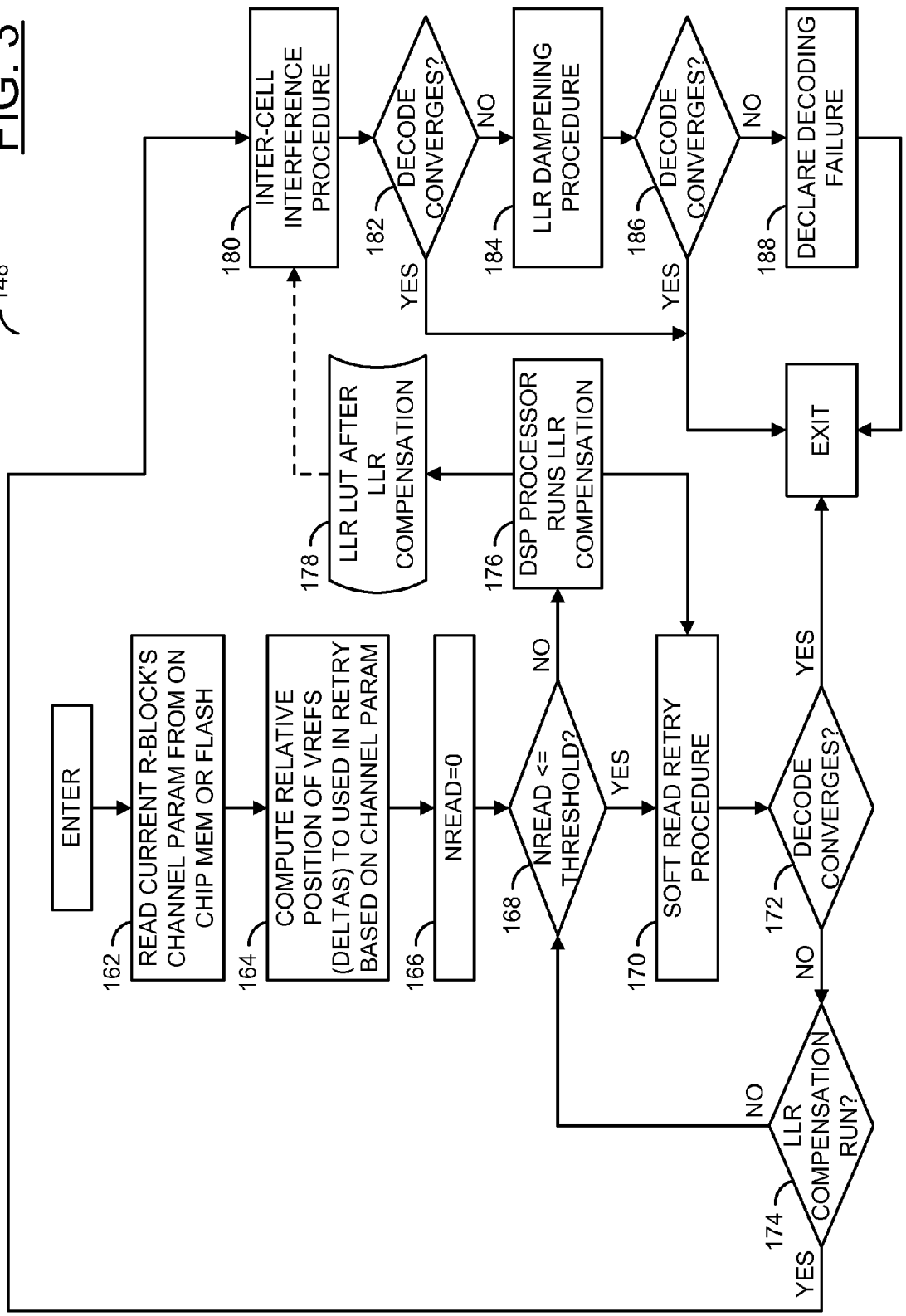
FIG. 3 is a flow diagram of an example implementation of a soft decision decoding process in accordance with an embodiment of the invention.

Referring to FIG. 3, a flow diagram of an example implementation of the soft decision decoding process 148 is shown in accordance with an embodiment of the invention. The process (or method) 148 is implemented by the circuit 100. The process 148 generally comprises a step (or state) 162, a step (or state) 164, a step (or state) 166, a step (or state) 168, a step (or state) 170, a step (or state) 172, a step (or state) 174, a step (or state) 176, a step (or state) 178, a step (or state) 180, a step (or state) 182, a step (or state) 184, a step (or state) 186 and a step (or state) 188. The steps 162 to 188 may represent modules and/or blocks that may be implemented as hardware, software, a combination of hardware and software, or other implementations. The sequence of the steps is shown as a representative example. Other step orders may be implemented to meet the criteria of a particular application.

In some embodiments, the process 148 involves multiple (e.g., three) recovery procedures: a soft read retry, an inter-cell interference cancellation and a log-likelihood ratio dampening for hard error mitigation. The circuit 100 does not go to a next procedure if a currently executed recovery procedure succeeds in decoding the codeword. The soft read retry is done in an incremental manner. If N reads still fail the soft-decision decoding, an additional read is performed and the soft-decision decoding is run again with updated soft decision parameters.

In the step 162, channel parameters of a current block or R-block are read from on-chip memory (e.g., the circuit 114) or from the circuit 94. (An R-block is a combination of blocks that can be combined to form a redundant array of silicon independent elements, similar to a redundant array of independent disks for magnetic media. In some embodiments, organizing a plurality of blocks in R-blocks reduces an overhead of block management.) In the step 164, a processor (e.g., the circuits 120 and/or 122) computes relative positions of the reference voltages (e.g., VREF) or changes (deltas) of the reference voltages used in the retry based on the channel parameters. A read count (e.g., NREAD) is initialized (e.g., set to zero) in the step 166.

A check is performed in the step 168 to determine if the read count NREAD is less than or matches a threshold for a maximum number of retry reads. If the read count NREAD does not exceed the threshold, the circuit 100 performs a soft read retry procedure in the step 170 and increments the read count NREAD. If the soft read retry procedure converges in the soft-decision decoder circuit 118 per the step 172, the process 148 exits. If not, a check is made in the step 174 to determine if the current soft read retry is a log likelihood ratio (e.g., LLR) compensation run. If the current soft read retry is not a log likelihood ratio compensation run, the method 148 returns to the step 168 and rechecks the read count NREAD against the threshold.

Once the read count NREAD exceeds the threshold, a processor (e.g., the circuit 120) runs a log likelihood ratio compensation. For example, a log likelihood ratio lookup table (e.g., LLR LUT) used in the previous step 170 is adjusted based on statistics of the block being read to increase the probability that soft-decision decoding will converge. Entries of the log likelihood ratio lookup table from the log likelihood ratio compensation are buffered in the step 178. The entries are also presented back to the step 170 to perform an additional soft read retry. If the decoding converges, the process 148 exits. If not, the check in the step 174 concludes that the log likelihood ratio compensation run has been performed and so continues with the step 180.

In the step 180, an inter-cell interference procedure is performed by the circuit 100. The inter-cell interference procedure uses the entries from the log likelihood ratio lookup table buffered in the step 178. A check is performed in the step 182 to determine if the inter-cell interference procedure results in a converged decode. If the decoding converges, the process 148 exits. If not, a log likelihood ratio dampening procedure is performed in the step 184. If the decoding converges in the step 186 due to the log likelihood ratio dampening procedure, the process 148 exist. If not, a decoding failure is declared in the step 188 and the process 148 exits.

In some embodiments, an order of the recovery steps is chosen such that the earlier steps have a higher probability of successfully decoding the codeword in the presence of one or more errors. Such an order reduces a performance penalty of the circuit 100 due to the error recovery. The procedure that is more likely to yield success may be initially run. The amount of time each procedure takes to run could also be taken into account. For example, if two or more procedures take approximately a similar amount of time run, the procedure with the higher chance of converging is run first.

In some embodiments, the procedure that nominally converges in a least amount of time may be initially run. The probability of converging may also be taken into account. For example, consider M procedures each with a probability of converging Pm and with a probability function that defines the probability of convergence in a given amount of time. A decision tree is created which runs the M procedures in a particular order to converge toward a goal configured per a usage model (e.g., in a small amount of time overall or a small mean), or to get a small median, or to get a tight distribution, or to get a small percentage above a standard deviation to the mean.

In some embodiments, multi-processor parallelism is utilized to reduce the recovery time. For example, while a processor (e.g., the circuit 122) issues an additional read command for the failed page and works on other host requests, another processor (e.g., the circuit 120) is working on computing the log likelihood ratio lookup table, which can be sent to the circuit 116 when the additional read results are transferred from circuit 94 and are ready to be processed.

Figure 4:
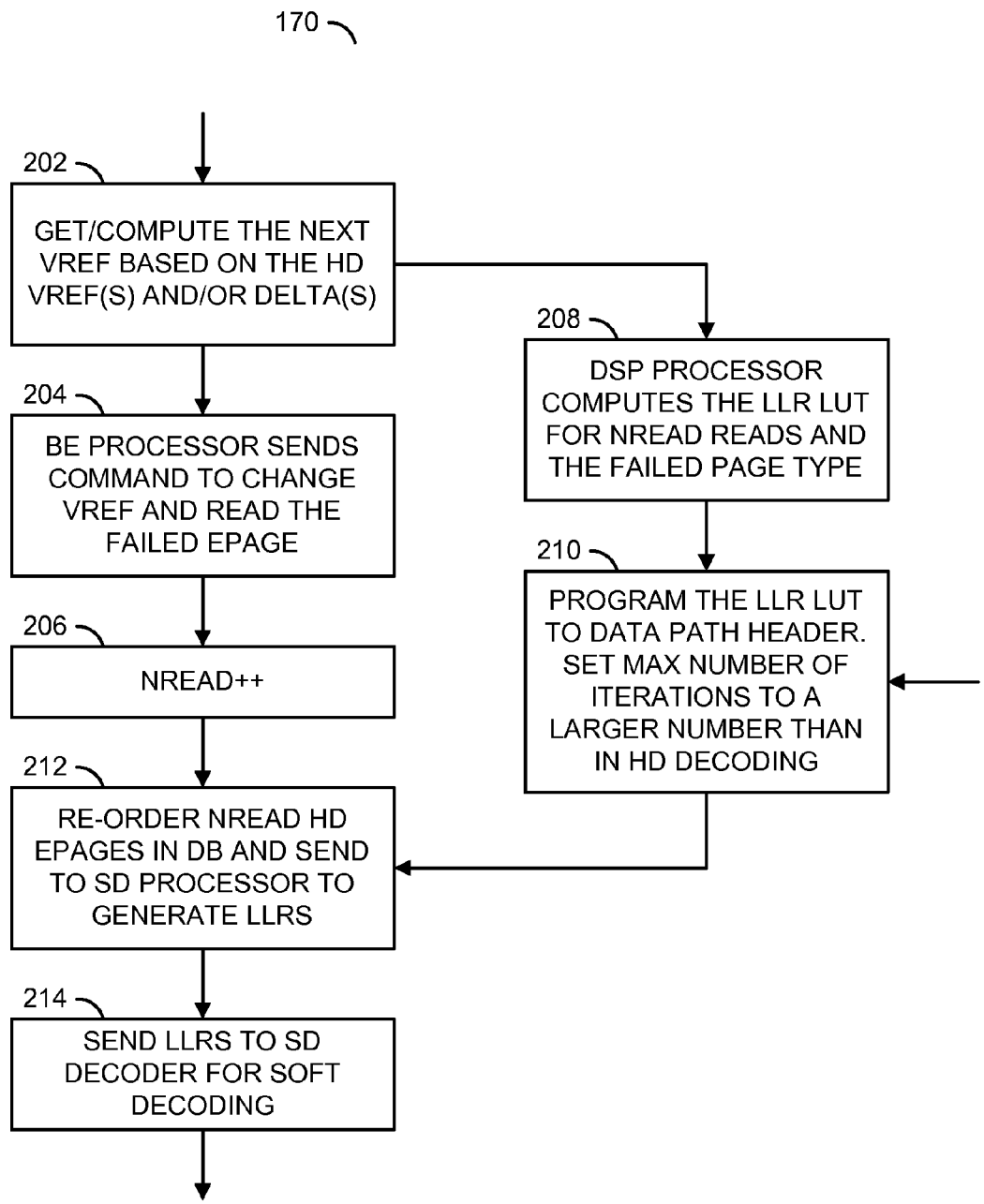
FIG. 4 is a flow diagram of an example implementation of a soft read retry procedure.

Referring to FIG. 4, a flow diagram of an example implementation of the soft read retry procedure 170 is shown. The procedure (or method or process) 170 is implemented by the circuit 100. The procedure 170 generally comprises a step (or state) 202, a step (or state) 204, a step (or state) 206, a step (or state) 208, a step (or state) 210, a step (or state) 212 and a step (or state) 214. The steps 202 to 214 may represent modules and/or blocks that may be implemented as hardware, software, a combination of hardware and software, or other implementations. The sequence of the steps is shown as a representative example. Other step orders may be implemented to meet the criteria of a particular application.

In the step 202, the circuit 100 may receive from the circuit 94 or compute internally a next reference voltage Vref based on the hard-decision reference voltage(s) and/or delta voltages used in the step 144, and/or in a previous iteration of the step 202. A processor (e.g., the circuit 122) sends a command to the circuit 94 in the step 204 to change the reference voltages and sends a command to read the failed Epage. In the step 206, the read count NREAD is incremented (e.g., increased by one).

Serially or in parallel (or substantially simultaneously) with the steps 202-206, a processor (e.g., the circuit 120) computes and/or retrieves the entries of the log likelihood ratio lookup table for the NREAD number of reads and the failed page type (e.g., an upper page or a lower page in a multi-level cell type of Flash memory). In a multi-level cell type memory, each memory cell generally stores multiple (e.g., 2) bits and utilizes more than 2 (e.g., 3) reference voltage levels. In the step 210, a processor (e.g., the circuit 120) programs the log likelihood ratio lookup table, such as to a data path header, for use by the circuit 118. In some embodiments, the step 210 also sets a maximum number of iterations to a larger number than used in the hard-decision decoding. The maximum number of iterations for the circuit 118 is increased in the error recovery with respect to the number of iterations used in the hard-decision (e.g., on-the-fly) decoding to increase a success probability of the soft read retry decoding. The probability of success is increased because, for some types of soft-decision decoding such as low-density parity-check decoding, the soft-decision decoding capability improves with an increasing number of iterations. The log likelihood ratio lookup table entries are available to the step 210 from the step 176 (FIG. 3).

A number (e.g., NREAD+1) of the hard-decision (142) and soft read retry (204) Epages in a data buffer (e.g., DB) of a processor (e.g., the circuit 122) are reordered in the step 212 and sent to the circuit 116 to generate the log likelihood ratio values. The log likelihood ratio values, the entries in the log likelihood ratio lookup table and the maximum number of iterations are sent to the circuit 118 as input parameters for a subsequent soft-decision decoding in the step 214. Convergence of the procedure 170 is subsequently checked in the step 172 (FIG. 3).

Figure 5:
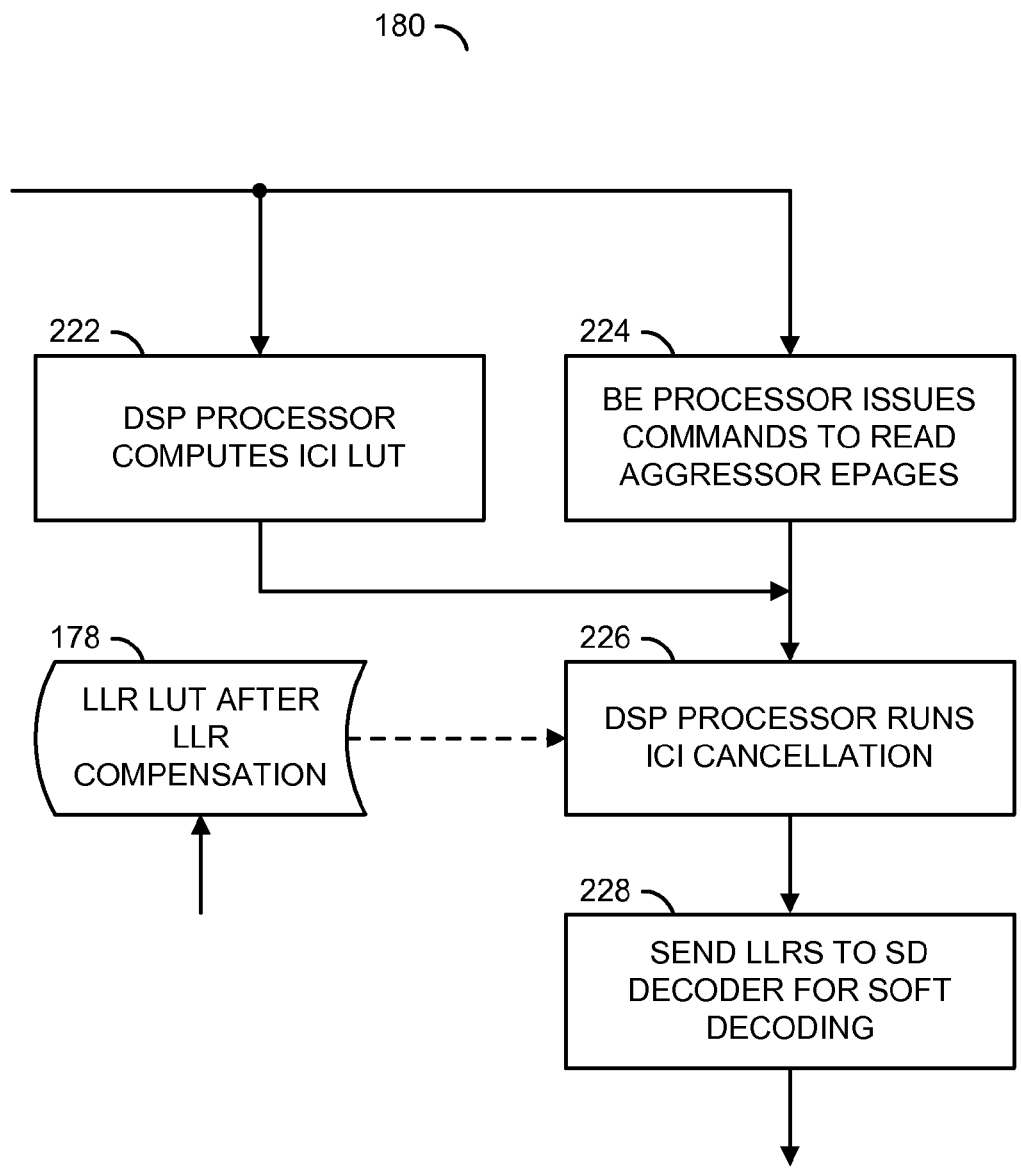
FIG. 5 is a flow diagram of an example implementation of an inter-cell interference procedure.

Referring to FIG. 5, a flow diagram of an example implementation of the inter-cell interference procedure 180 is shown. The procedure (or method or process) 180 is implemented by the circuit 100. The procedure 180 generally comprises a step (or state) 222, a step (or state) 224, a step (or state) 226 and a step (or state) 228. The steps 222 to 228 may represent modules and/or blocks that may be implemented as hardware, software, a combination of hardware and software, or other implementations. The sequence of the steps is shown as a representative example. Other step orders may be implemented to meet the criteria of a particular application.

If the log likelihood ratio compensation run fails, a processor (e.g., the circuit 120) computes entries for an inter-cell interference lookup table (e.g., ICI LUT) in the step 222. In parallel (or simultaneously) with the step 222, another processor (e.g., the circuit 122) issue commands to read one or more aggressor Epages. The aggressor Epages are, for example, the Epages stored physically (spatially) neighboring the failed Epage. In the step 226, a processor (e.g., the circuit 120) runs an inter-cell interference cancellation technique (or operation) based on the entries in the inter-cell interference lookup table, the log likelihood ratio lookup table (e.g., step 178) and the aggressor Epages. The Epage (in LLR form) resulting from the inter-cell interference cancellation technique is sent in the step 228 to the circuit 118 (e.g., the soft-decision decoder) for another soft-decision decoding. If the soft-decision decoding succeeds per the step 182 (FIG. 3), the method 148 exits. If not, the log likelihood ratio dampening procedure is run in the step 184 (FIG. 3).

Figure 6:
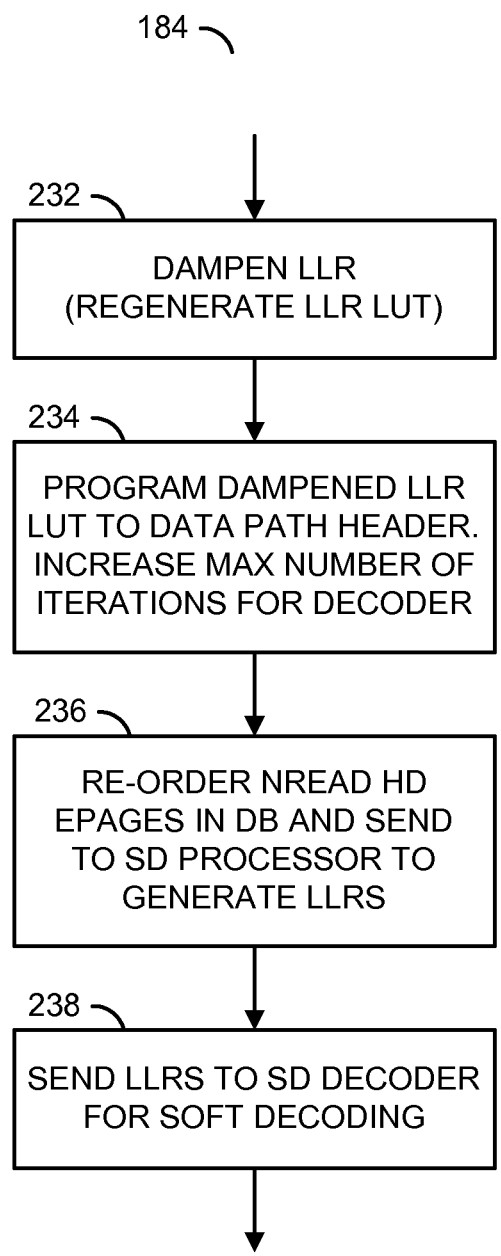
FIG. 6 is a flow diagram of an example implementation of a log likelihood ratio dampening procedure.

Referring to FIG. 6, a flow diagram of an example implementation of the log likelihood ratio dampening procedure 184 is shown. The procedure (or method or process) 184 is implemented by the circuit 100. The procedure 184 generally comprises a step (or state) 232, a step (or state) 234, a step (or state) 236 and a step (or state) 238. The steps 232 to 238 may represent modules and/or blocks that may be implemented as hardware, software, a combination of hardware and software, or other implementations. The sequence of the steps is shown as a representative example. Other step orders may be implemented to meet the criteria of a particular application.

In the step 232, a processor (e.g., the circuit 120) generates dampened values in the log likelihood ratio lookup table. The dampened log likelihood ratio lookup table entries are programmed for use by the circuit 118, such as via a data path header. In some embodiments, the maximum number of iterations for the circuit 118 (e.g., for a soft-decision low-density parity-check decoder) is increased in the step 234. In the step 236, the NREAD+1 hard-decision and read retry Epages in the data buffer of the circuit 122 are reordered and sent to a processor (e.g., the circuit 116) where new log likelihood ratio values are generated. The new log likelihood ratio values are sent to the circuit 118 for soft-decision decoding in the step 238. If the soft-decision decoding succeeds per the step 186 (FIG. 3), the method 148 exits. If not, failure is declared in the step 188 (FIG. 3).

The circuit 100 is designed to have a system-level policy for error recovery. The error recovery policy generally meets an unrecoverable bit error rate criteria at or beyond an end of life of the nonvolatile memory devices. The error recovery policy may also reduce the recovery time of codewords having one or more errors.

The functions performed by the diagrams of FIGS. 1-6 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application. As used herein, the term "simultaneously" is meant to describe events that share some common time period but the term is not meant to be limited to events that begin at the same point in time, end at the same point in time, or have the same duration.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
    a circuit configured to receive a codeword from a memory, wherein (i) the memory is nonvolatile and (ii) the codeword has one or more errors; and
    one or more processors configured to generate read data by a soft-decision decode of the codeword, wherein (A) the soft-decision decode uses a plurality of parameters calculated by (i) a first procedure, (ii) a second procedure in response to a plurality of failures of the soft-decision decode to converge using the first procedure and (iii) a third procedure in response to another failure of the soft-decision decode to converge using the second procedure and (B) at least one of (i) the second procedure adjusts the codeword with an inter-cell interference cancellation technique and (ii) the third procedure dampens the parameters used in the soft-decision decode.

2. The apparatus according to claim 1, wherein (i) the memory comprises a Flash memory, (ii) the soft-decision decode comprises a soft-decision low-density parity-check decode, (iii) the first procedure is more likely to converge the soft-decision low-density parity-check decode than the second procedure and (iv) the second procedure is more likely to converge the soft-decision low-density parity-check decode than the third procedure.

3. The apparatus according to claim 1, wherein the first procedure is configured to (i) change one or more reference voltages in the memory during each of a plurality of reads of the codeword from the memory and (ii) calculate a plurality of log-likelihood ratio values in a log-likelihood ratio table used in the soft-decision decode.

4. The apparatus according to claim 3, wherein a first of the processors calculates the changes of the reference voltages in parallel with the calculation of the log-likelihood ratio values by a second of the processors.

5. The apparatus according to claim 3, wherein the processors are further configured to (i) compensate the log-likelihood ratio values in response to a failure of the soft-decision decode to converge and (ii) decode the codeword an additional time after the compensation and before using the second procedure.

6. The apparatus according to claim 1, wherein (i) the second procedure initiates a read of one or more aggressor codewords from the memory, (ii) the adjustment is based on the aggressor codewords, and (iii) the aggressor codewords are spatial neighbors of the codeword in the memory.

7. The apparatus according to claim 1, wherein a first of the processors issues a command to read one or more aggressor codewords in parallel with a calculation of a lookup table used in the inter-cell interference cancellation technique by a second of the processors.

8. The apparatus according to claim 1, wherein the third procedure is configured to calculate the parameters as a plurality of log-likelihood ratio values.

9. The apparatus according to claim 1, wherein the soft-decision decode using the parameters calculated by the first procedure is faster than the soft-decision decode using the parameters calculated by the second procedure.

10. The apparatus according to claim 1, wherein the apparatus is implemented as one or more integrated circuits.

11. A method for soft-decision decoding, comprising the steps of:
    (A) receiving a codeword from a memory, wherein (i) the codeword has one or more errors and (ii) the memory is nonvolatile; and
    (B) generating read data by a soft-decision decode of the codeword, wherein (A) the soft-decision decode uses a plurality of parameters calculated by (i) a first procedure, (ii) a second procedure in response to a plurality of failures of the soft-decision decode to converge using the first procedure and (iii) a third procedure in response to another failure of the soft-decision decode to converge using the second procedure and (B) at least one of (i) the second procedure adjusts the codeword with an inter-cell interference cancellation techniaue and (ii) the third procedure dampens the parameters used in the soft-decision decode.

12. The method according to claim 11, wherein (i) the memory comprises a Flash memory, (ii) the soft-decision decode comprises a soft-decision low-density parity-check decode, (iii) the first procedure is more likely to converge the soft-decision low-density parity-check decode than the second procedure and (iv) the second procedure is more likely to converge the soft-decision low-density parity-check decode than the third procedure.

13. The method according to claim 11, wherein the first procedure comprises the steps of:
    changing one or more reference voltages in the memory during each of a plurality of reads of the codeword from the memory; and
    calculating a plurality of log-likelihood ratio values in a log-likelihood ratio table used in the soft-decision decode.

14. The method according to claim 13, wherein the changing of the reference voltages are calculated in parallel with the calculating of the log-likelihood ratio values.

15. The method according to claim 13, further comprising the steps of:
    compensating the log-likelihood ratio values in response to a failure of the soft-decision decode to converge; and
    decoding the codeword an additional time after the compensating and before using the second procedure.

16. The method according to claim 11, wherein (i) the second procedure. initiates a read of one or more aggressor codewords from the memory, (ii) the aggressor codewords are spatial neighbors of the codeword in the memory and (iii) the adjusting is based on the aggressor codewords.

17. The method according to claim 11, wherein one or more aggressor codewords are read in parallel with a calculation of a lookup table used in the inter-cell interference cancellation technique.

18. The method according to claim 11, wherein the third procedure comprises the step of:
    calculating the parameters as a plurality of log-likelihood ratio values.

19. The method according to claim 11, wherein the soft-decision decode using the parameters calculated by the first procedure is faster than the soft-decision decode using the parameters calculated by the second procedure.

20. An apparatus comprising:
    means for receiving a codeword from a memory, wherein (i) the codeword has one or more errors and (ii) the memory is nonvolatile; and
    means for generating read data by said a soft-decision decode of the codeword, wherein (A) the soft-decision decode uses a plurality of parameters calculated by (i) a first procedure, (ii) a second procedure in response to a plurality of failures of the soft-decision decode to converge using the first procedure and (iii) a third procedure in response to another failure of the soft-decision decode to converge using the second procedure and (B) at least one of (i) the second procedure adjusts the codeword with an inter-cell interference cancellation technicrue and (ii) the third procedure dampens the parameters used in the soft-decision decode.

* * * * *

UNITED STATES PATENT AND TRADEMARK OFFICE
CERTIFICATE OF CORRECTION

PATENT NO. : 9,021,332 B2
APPLICATION NO. : 13/798864
DATED : April 28, 2015
INVENTOR(S) : Erich F. Haratsch et al.

It is certified that error appears in the above-identified patent and that said Letters Patent is hereby corrected as shown below:

In the claims

Column 10, Claim 20, line 5, delete "said".

Column 11, Claim 20, line 14, replace "technicrue" with "technique".

Signed and Sealed this
Twentieth Day of October, 2015

Michelle K. Lee
*Director of the United States Patent and Trademark Office*